United States Patent
Roche et al.

(10) Patent No.: US 9,977,107 B2
(45) Date of Patent: May 22, 2018

(54) ATLAS-FREE BRAIN TISSUE SEGMENTATION METHOD USING A SINGLE T1-WEIGHTED MRI ACQUISITION

(71) Applicant: SIEMENS HEALTHCARE GMBH, Erlangen (DE)

(72) Inventors: Alexis Roche, Jouxtens-Mezery (CH); Tobias Kober, Lausanne (CH); Gunnar Krueger, Lausanne (CH)

(73) Assignee: Siemens Healthcare GmbH, Erlangen (DE)

( * ) Notice: Subject to any disclaimer, the term of this patent is extended or adjusted under 35 U.S.C. 154(b) by 620 days.

(21) Appl. No.: 13/855,972

(22) Filed: Apr. 3, 2013

(65) Prior Publication Data

US 2014/0303478 A1    Oct. 9, 2014

(51) Int. Cl.
*A61B 5/05* (2006.01)
*G01R 33/56* (2006.01)
*G01R 33/48* (2006.01)

(52) U.S. Cl.
CPC ...... *G01R 33/5608* (2013.01); *G01R 33/4828* (2013.01)

(58) Field of Classification Search
None
See application file for complete search history.

(56) References Cited

U.S. PATENT DOCUMENTS 6,249,595 B1 * 6/2001 Foxall et al. .............. 382/128
9,129,382 B2   9/2015 Fan et al.

FOREIGN PATENT DOCUMENTS

| CN | 102393963 A | 3/2012 |
|---|---|---|
| CN | 102596025 A | 7/2012 |
| CN | 102622749 A | 8/2012 |

OTHER PUBLICATIONS

Kober et al., "Atlas-free Brain Tissue Segmentatiion Using a Single T1-weighted MRI Acquisition", ISMRM, May 11, 2012.*
Ribes et al., "Who said fat is bad? Skull-stripping benefits from additional fat image", 2011.*
Marques et al., "MP2RAGE, a self bias-field corrected sequence for improved segmentation and T1-mapping at high field", NeuroImage 49, 2010.*

(Continued)

*Primary Examiner* — Christopher Cook
(74) *Attorney, Agent, or Firm* — Laurence Greenberg; Werner Stemer; Ralph Locher (57) ABSTRACT

An atlas-free magnetic resonance imaging method images at least one part of a brain. An MRI sequence configured for acquiring two image volumes of the part at different inversion times within a single acquisition is combined to a fat-water separation method for acquiring a fat-water separated image. For each echo time two image volumes are acquired, respectively a first image volume and a second image volume at the first echo time, and a first image volume and a second image volume at the second echo time, and combined to a uniform image. The acquired images are combined to form a final uniform image, a final fat-water separated image, and a final second image volume that are fed into a multichannel image segmentation algorithm using a Markov random field model for segmenting the part into multiple classes of cranial tissues, in order to obtain a segmented image of said part.

9 Claims, 4 Drawing Sheets

(56) References Cited

OTHER PUBLICATIONS van der Kouwe et al., "Brain morphometry with multiecho MPRAGE", Neuro Image 40, 2008.*
20th ISMRM Program for Kober et al. reference.*
Fujimoto et al., "Comparison of Cortical Surface Reconstructions from MP2RAGE datat at 3T and 7T", Proc. Intl. Soc. Mag. Reson. Med. 19, 2011.*
Suri et al., "Multi-Modality State-of-the-Art Medical Image Segmentation and Registration Methodologies", 2011.*
Leroy et al., "Atlas-Free Surface Reconstruction of the Cortical Grey-White Interface in Infants", Nov. 2011.*
Gui et al., "Automatic Segmentation of Newborn Brain MRI Using Mathematical Morphology", ISBI 2011, pp. 2026-2030.*
Roche, Alexis, "Closed-Form Relaxation for MRF-MAP Tissue Classification Using Discrete Laplace Equations", MICCAI 2012, pp. 355-362.*
Pham et al., "Unsupervised Tissue Classification", Chapter 12 of Handbook of Medical Image Processing and Analysis, Dec. 2008.*
Van Leemput et al., "Automated Model-Based Tissue Classification of MRI Images of the Brain", IEEE Transactions on Medical Imaging, vol. 18, No. 10, Oct. 1999, pp. 897-908.
Roche et al., "On the convergence of EM-like algorithms for image segmentation using Markov random fields", Medical Image Analysis 15, 2011, pp. 830-839.
Marques et al., "MP2RAGE, a self bias-field corrected sequence for improved segmentation and T1-mapping at high field", NeuroImage 49, 2010, pp. 1271-1281.
Dixon, W. Thomas, "Simple Proton Spectroscopic Imaging", Radiology 1984, 153, pp. 189-194.

* cited by examiner

ATLAS-FREE BRAIN TISSUE SEGMENTATION METHOD USING A SINGLE T1-WEIGHTED MRI ACQUISITION

BACKGROUND OF THE INVENTION

Field of the Invention

The invention relates to a method and a system for the removal of non-cerebral tissue in Magnetic Resonance (MR) imaging. In particular, the invention relates to a method and a system for removing image parts representing non-brain tissues, such as skull, scalp, veins or meninges, from a MR neuro-image, and for automatically segmenting brain magnetic resonance images.

In order to obtain images using the technique of MR imaging, the subject to be imaged is placed in a strong static magnetic field B0, which forces the hydrogen nuclear magnetic moments associated with the subject hydrogen nuclear spins to adopt an orientation parallel or anti-parallel with respect to said static magnetic field. The spin axes are not exactly aligned with the static magnetic field, but they precess around a direction axis of said static magnetic field with a characteristic frequency, giving rise to a net magnetization in the direction of the static magnetic field. In order to stimulate a signal from the hydrogen nuclei, a pulse of radio frequency energy, called RF pulse and to which is associated a magnetic field B1, can be applied to the subject at the aforementioned characteristic frequency, called Larmor frequency, which is for one type of nuclei proportional to the flux density of the magnetic field. The radio frequency energy associated with this pulse disturbs the net magnetization from its equilibrium, rotating it away from the static magnetic field with an angle, called flip angle, which depends on the strength and duration of the magnetic component of the electromagnetic radio frequency radiation. Consequently, the net magnetization begins to precess around the static magnetic field main axis, its transverse component inducing an electromotive force in a receiver coil according to Faraday's law of magnetic induction. This electromotive force gives rise to an induced signal that is then at the basis of MR image reconstruction. The magnitude of this induced signal depends, among other factors, on the number of nuclei that produce the magnetization, on their relaxation times, i.e. the time needed by the net magnetization to return to its equilibrium state along the axis of said strong magnetic field. Other factors include the so called spin preparation. In order to optimize a diagnostic value of the signal, different combinations of one or more radio frequency pulses have been proposed, while taking into account some parameters like a repetition time of the pulse, its echo time, the flip angle, its bandwidth, etc.

The time required for a substance to become magnetized after having been placed in a magnetic field or the time required for said substance to regain longitudinal magnetization following the radiofrequency pulse is usually called the longitudinal relaxation time T1 (also called spin-lattice relaxation). This longitudinal relaxation time T1 is in particular determined by thermal interactions between resonating protons and other protons and other magnetic nuclei in the environment submitted to the magnetic field. The longitudinal relaxation time T1 depends in particular on the relationship between the natural vibrational frequencies of said substance and said Larmor frequency. Similarly, a transverse relaxation time T2 (also called spin-spin relaxation) describes the interaction between neighbouring nuclei with identical precessional frequencies having different magnetic quantum states, and represents a measure of how long a transverse magnetization last following the radiofrequency pulse. The transverse relaxation time T2 characterizes thus the exponential decay of the induced signal resulting from the decline of coherence of the spin precession.

Each tissue of the human body is thus characterized by an own longitudinal relaxation time T1 and an own transverse relaxation time T2. Numerous studies used T1 weighted protocols, i.e. protocols giving rise to images where most of the contrast of the tissues is due to differences in the values of the longitudinal relaxation time T1, for imaging soft tissues, and in particular the brain, since said T1 weighted protocols generally offer a good contrast between the tissues forming the brain, like grey or white cerebral matter. Moreover, the evolution of high-resolution MR imaging of the last decades enabled advanced post-processing of brain images, enhancing the contrast between the tissues forming the brain. Brain contrast is for example crucial in morphometry, since quantitative measures are derived from the image data to determine the volume of certain brain tissues like grey or white cerebral matter, for supporting then diagnostic decisions and facilitating follow-up comparisons. Moreover, many studies investigating the aging brain or disease-induced brain alterations rely on accurate and reproducible brain tissue segmentation, i.e. the differentiation between brain and non-brain tissue in a MR image.

Unfortunately, one major problem in MR neuro-imaging is to obtain a good contrast for discriminating brain tissues from non-brain tissues like the skull. Often, the parts of the image representing non-brain tissues have to be erased before such an advanced image post-processing can be conducted. This process, usually called skull-stripping, is hampered by very similar image intensities of wanted and unwanted tissues, possibly leading to the elimination of too much or too little non-brain tissue, which can bias the final outcome of the following post-processing, and at worst, falsely influence the diagnostic decision.

Different methods involving various skull-stripping algorithms have been used for differentiating brain from non-brain tissues. Various methods are based exclusively on T1 weighted protocols, like the method described by Suresh et al. in the paper NeuroImage 49, 225 (2010), wherein intensity thresholding followed by removal of narrow connections using graph cut segmentation theory is used to remove non brain tissue. Also, the currently prominent MR acquisition sequences in clinical practice such as the Magnetization-Prepared Rapid Gradient-Echo (MPRAGE) provide images in which there are significant overlaps between intensity ranges corresponding to different tissues, making image segmentation challenging. To work around such acquisition-related problems, most existing neuroimaging software packages like SPM, FSL or FreeSulier use non-rigid image registration towards a pre-computed digital brain atlas. Typically, a segmentation algorithm relying on an atlas, i.e. pre-segmented template data, that provides a-priori information drawn from a particular subject cohort is used for processing brain image data acquired. Unfortunately, pre-segmented information may bias the image segmentation towards the normal anatomy encoded by the atlas. Indeed, brain morphology may differ considerably depending on age, sex and race. In addition, diseased brains may deviate significantly from the atlas information typically gained from healthy volunteers. The imposed prior atlas information can thus lead to degradation of segmentation results and is not enough accurate for being applied to each particular brain. Moreover, it is also computationally extensive.

Therefore, there is still a need for improving the outcome of the skull-stripping procedure.

SUMMARY OF THE INVENTION

It is accordingly an object of the invention to provide an atlas-free brain tissue segmentation method of removal of non-brain tissue of a MR head image in order to enable accurate measurement of brain structures and thus secure MR imaging diagnosis. Indeed, the improvement of skull-stripping methods is of vital interest for all advanced brain post-processing techniques.

With the foregoing and other objects in view there is provided, in accordance with the invention, an atlas-free magnetic resonance imaging method configured for imaging at least one part of a brain, the method comprising the steps of:

using a magnetic resonance imaging (MRI) sequence characterized at least by a first inversion time TI1, a second inversion time TI2, a first echo time TE1, a second echo time TE2, a repetition time TR, a first flip-angle, and a second flip-angle and configured for acquiring two image volumes, respectively a first image volume and a second image volume, of said part at different inversion times TI1 and TI2 within a single acquisition, wherein said MRI sequence is a Magnetization-Prepared 2 Rapid Gradient-Echoes (MP2RAGE) sequence, which advantageously provides a bias-free T1 contrast with heavily reduced T2*—and PD— weighting compared to a standard MPRAGE. T2* is the time constant describing the exponential decay of signal, due to spin-spin interactions, magnetic field inhomogeneities, and susceptibility effects. T2* is thus a measure of a loss of coherence in an ensemble of spins that include all interactions. PD is the Proton Density, i.e. the concentration of mobile Hydrogen atoms within a sample of tissue;

using a Dixon method combined with the MP2RAGE for acquiring a fat-water separated image of said part, i.e. choosing the echo time TE1 and TE2 of said MRI sequence so that each echo time TE1, TE2 is based on the chemical shift between fat and water, i.e. so that their difference TE2−TE1 is such that the fat and water signals accumulate a phase difference, the fat and water component being in-phase and opposed-phase. Advantageously, the Dixon method allows to acquire, in lieu of conventional T1-weighted images, a fat-water separated image in which fat and dura matter appear with intensity ranges very distinct from all other tissues. Advantageously, the information gained by the fat-water separated image considerably improves the skull-stripping outcome. Dixon's original method for water and fat separation (cf. Dixon W. T., *Simple proton spectroscopic imaging*, Radiology 1, 189 (1984)) acquires two images with different echo times chosen such that the water and fat are in-phase and opposed-phase, respectively, and may be combined to obtain separate water and fat images. This simple method assumes that the water is exactly on resonance which limits the performance of water and fat separation in the presence of B0-field inhomogeneity; other, more advanced methods obtaining a fat-water separated image may be applied here, too.

using MRI and said MRI sequence for acquiring for each echo time said two image volumes, respectively the first image volume and the second image volume at the first echo time, and the first image volume and the second image volume at the second echo time;

for each echo time, combining the two image volumes to a "uniform" image, i.e. a homogenous image given by Real(A+B*)/($|A|^2+|B|^2$) [operator*being complex conjugate] as detailed in the paper Marques et al., Neuroimage 49, 1271 (2010), respectively a first uniform image at the first echo time and a second uniform image at the second echo time. Advantageously, the MP2RAGE sequence allows to increase the contrast properties of the image volumes;

applying a fat-water separation method, e.g. the Dixon method, to the first image volume of the first and second echo time for obtaining a first fat-water separated image and/or applying said fat-water separation method, e.g. said Dixon method, to the second image volume of the first and second echo time for obtaining a second fat-water separated image;

feeding a multichannel image segmentation algorithm with at least the following input images:
a final uniform image resulting from a combination of said uniform images,
a final fat-water separated image resulting from a combination of said fat-water separated images,
a final second image volume resulting from a combination of said second image volumes, wherein said multichannel image segmentation algorithm uses a Markov random field (MRF) model (Van Leemput et al., IEEE Transactions on Medical Imaging 18(10), 897-908 (1999); Roche et al., Medical Image Analysis 15(6) 830-839 (2011)) for segmenting said part into multiple classes of cranial tissues from data arising from the input images; and outputting a segmented image of the part.

The MP2RAGE sequence is a modified MPRAGE sequence configured for generating two different images at different inversion times in order to overcome image quality degradation arising from the spatial inhomogeneity in transmit B1 field that is observable in human MR images at high static magnetic fields B0. The MP2RAGE technique is in particular described by Marques et al. in the paper Neuroimage 49, 1271 (2010) and involves a double-echo sequence, namely a first rapid gradient echo block at a first inversion time TI1 separated by a delay TB from a second rapid gradient echo block at a second inversion time TI2. Two images representing a same volume are thus obtained.

The Dixon method is based on the fact that the resonance frequency of the fat is different than that of water. The fat and water information encoded in the induced current signal can be extracted from said current signal according to the Dixon method. The chemical shift $\delta$ of resonance signals of fat and water in body tissues relative to each other, or in other words their mutual resonance frequency difference, is $\delta=3.4$ ppm, which would correspond to the difference of circa 68 Hz in approximately 0.5 Tesla magnetic field. At 3 Tesla, the change in frequency is $\Delta f=\delta\gamma B0=434$ Hz, where $\gamma$ is the gyromagnetic ratio of protons in the target and B0 the static magnetic field strength. By adjusting the echo times in an imaging sequence of the above described type so that their difference TE2−TE1 equals $k/(2\Delta f)$ (for k= 1, 3, 5, . . . ), water and fat signals accumulate a phase difference of $k\pi$ radians between the first and the second echo. Thus, the phase difference amounts to $\varphi=TE1\cdot\Delta f/(2\pi)$ radians at time TE1 and $\varphi+k\pi$ radians at time TE2.

The present invention describes thus a method capable of automatically segmenting a brain magnetic resonance image for image-guided diagnosis or intervention by combining the water-fat separation (e.g. Dixon) method and the MP2RAGE MRI sequence. In particular, the present method might be applied to each scan of the brain in order to reconstruct a 3 dimensional (3D)-brain and obtain a 3D-image of the whole brain. In particular, the step of feeding a multichannel image segmentation algorithm might be followed by a removal of voxels outside the total intra-cranial volume (TIV), also called skull stripping, wherein a total intracranial volume extraction might be preferentially achieved by means of standard mathematical morphology operations for removing non-brain voxels classified as fluid (opening, largest connected component extraction and hole-filling). Preferentially, a further tissue classification of the remaining voxels into cerebrospinal fluid, gray matter and white matter might be performed after said removal of voxels outside the total intra-cranial volume. Advantageously, said tissue classification is a fundamental step in brain morphometry applications which aim to provide clinicians with volumetric measurements associated with a patient and compare them with given normative ranges in order to detect potential diseases or evaluate treatment efficacy.

Preferentially, the MRF model is a 7-class model that considers gray matter, white matter, fluid, dura matter, muscle, fat and air, as the distinct tissues contributing to the input images. In other words, the MRF model is able to use image data arising from the two image volumes, the uniform image and the fat-water separated image for segmenting said part of the brain into 7 classes of cranial tissues. In particular, the MRF model according to the invention comprises soft topological constraints that are configured for imposing spatial relation between different tissues depending on the tissue association. In other words, the MRF model is able to enforce topological constraints by penalising anatomically impossible links or relation between brain tissues and non-brain classes, thus rendering the segmentation more robust to image noise. The MRF model also preferentially includes a sampling model of all input channels (e.g. two channels in the case of a T1-weighted image and a fat image) feeding said multichannel image segmentation algorithm, so as to incorporate multichannel information into the segmentation process.

Preferentially, the output of image segmentation, i.e. said segmented image, is a label image computed, e.g., using maximum a posteriori estimation via conventional machine learning methods such as the variational EM algorithm or graph cuts.

Although the invention is illustrated and described herein as embodied in a method for imaging at least one part of a brain, said method being free of a pre-computed digital brain atlas use, it is nevertheless not intended to be limited to the details shown, since various modifications and structural changes may be made therein without departing from the spirit of the invention and within the scope and range of equivalents of the claims.

In particular, the present invention concerns also a MRI system for performing the previously described method. Preferably, said MRI system comprises a non-transitory computer readable medium storing computer program instructions which, when loaded into a main memory of a computer, cause the system to carry out at least the following steps:

using a Dixon method for acquiring a fat-water separated image of a part of a brain;

acquiring for a first inversion time TI1 and a second inversion time TI2 two image volumes, respectively a first image volume and a second image volume at a first echo time, and a first image volume and a second image volume at a second echo time;

for each echo time, combining the two image volumes to a "uniform" image, respectively a first uniform image at the first echo time and a second uniform image at the second echo time;

applying a fat-water separation method to the first image volume of the first and second inversion time TI1 and TI2 for obtaining a first fat-water separated image and/or applying a fat-water separation method to the second image volume of the first and second inversion time TI1 and TI2 for obtaining a second fat-water separated image;

feeding a multichannel image segmentation algorithm with at least the following input images:
 a final uniform image resulting from a combination of said uniform images,
 a final fat-water separated image resulting from a combination of said fat-water separated images,
 a final second image volume resulting from a combination of said second image volumes,
wherein said multichannel image segmentation algorithm uses a Markov random field model for segmenting said part into multiple classes of cranial tissues from data arising from the input images; and outputting a segmented image of said part.

Finally, the claimed method and system will be best understood from the following description of specific embodiments when read in connection with the accompanying drawings.

DETAILED DESCRIPTION

Figure 1A:
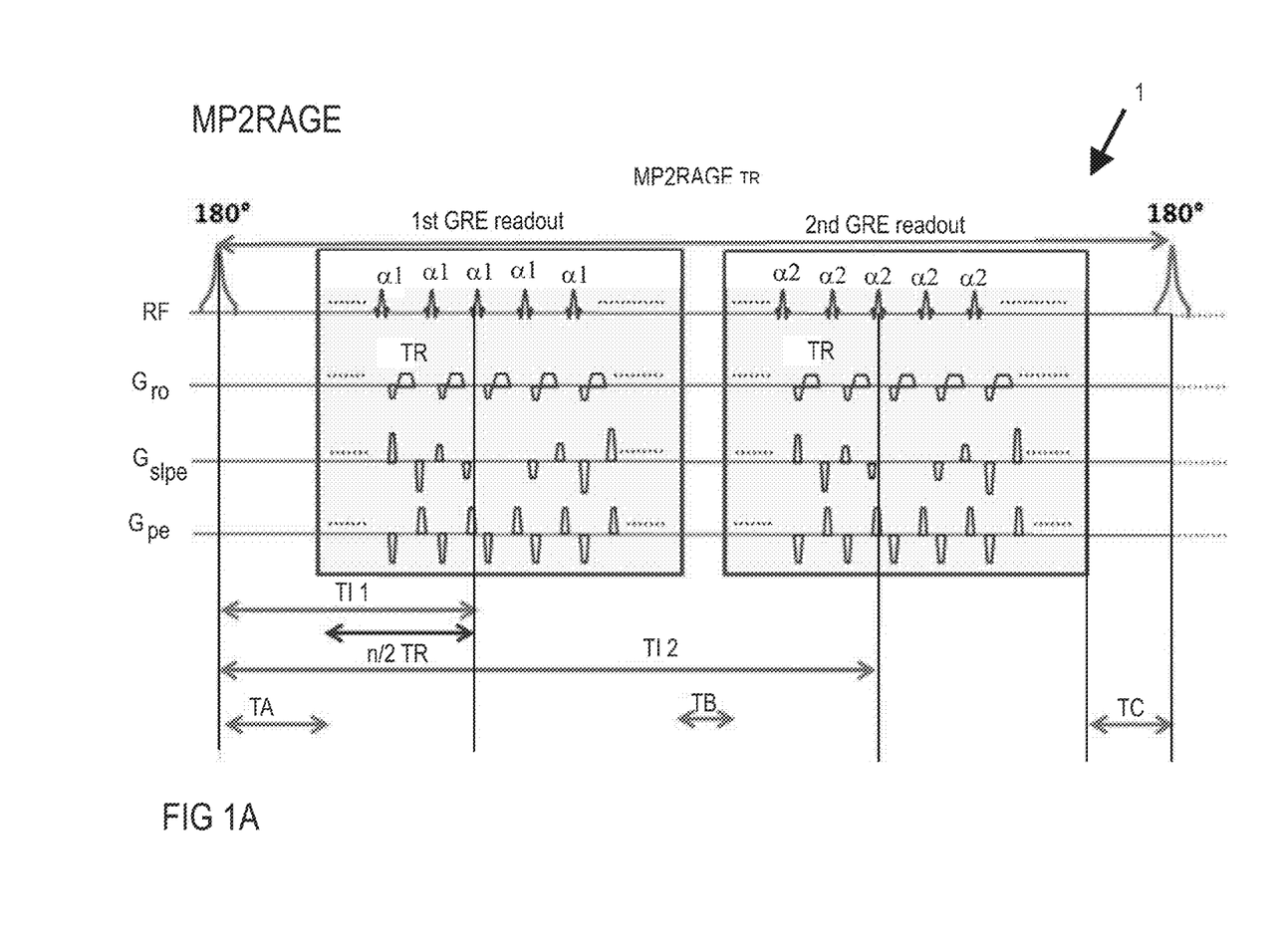
FIGS. 1A, 1B and 1C show schematic representation of a combination of a MRI MP2RAGE sequence and the Dixon fat-water separation technique giving rise to the MRI sequence according to the invention.
Figure 1B:
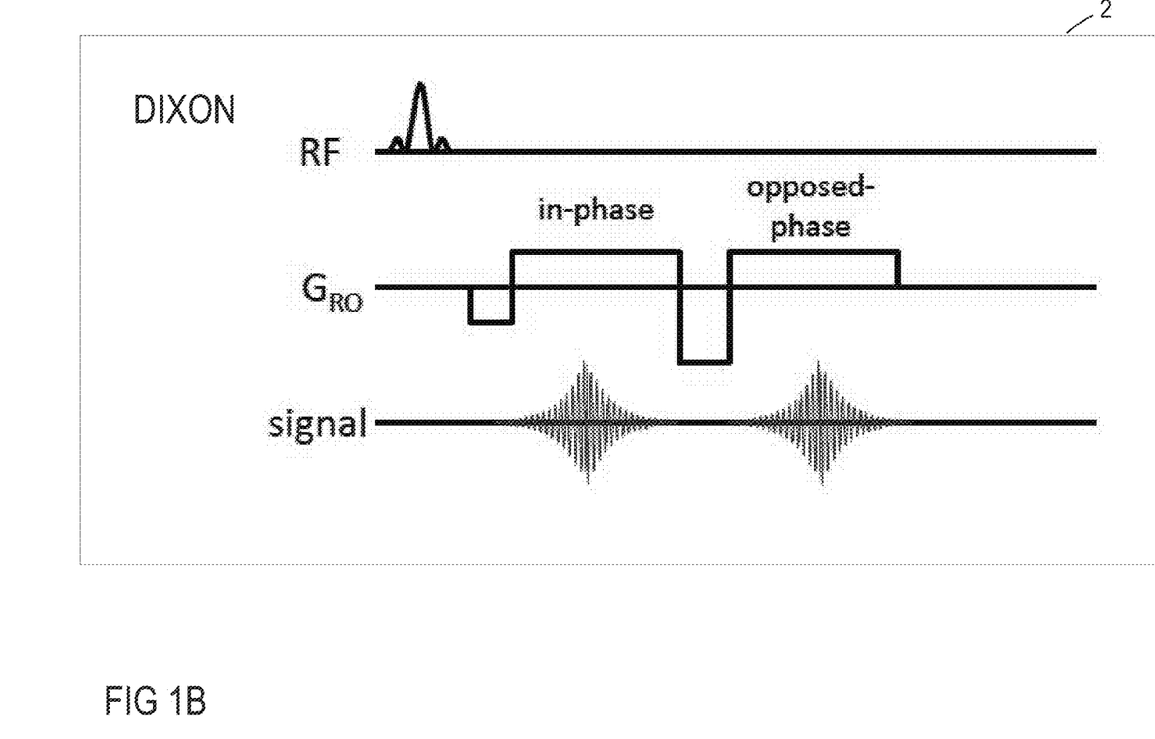
Figure 1C:
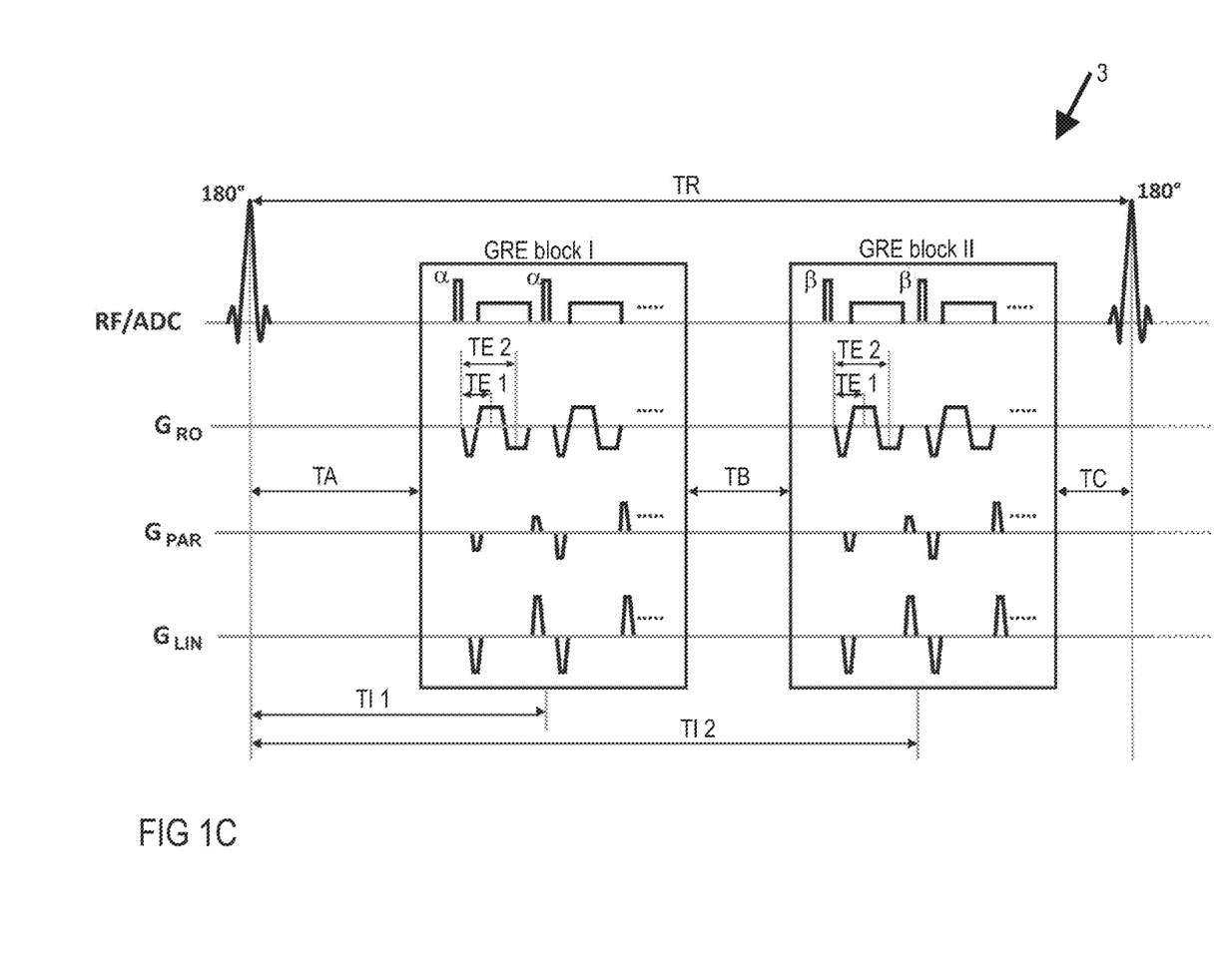
Figure 2:
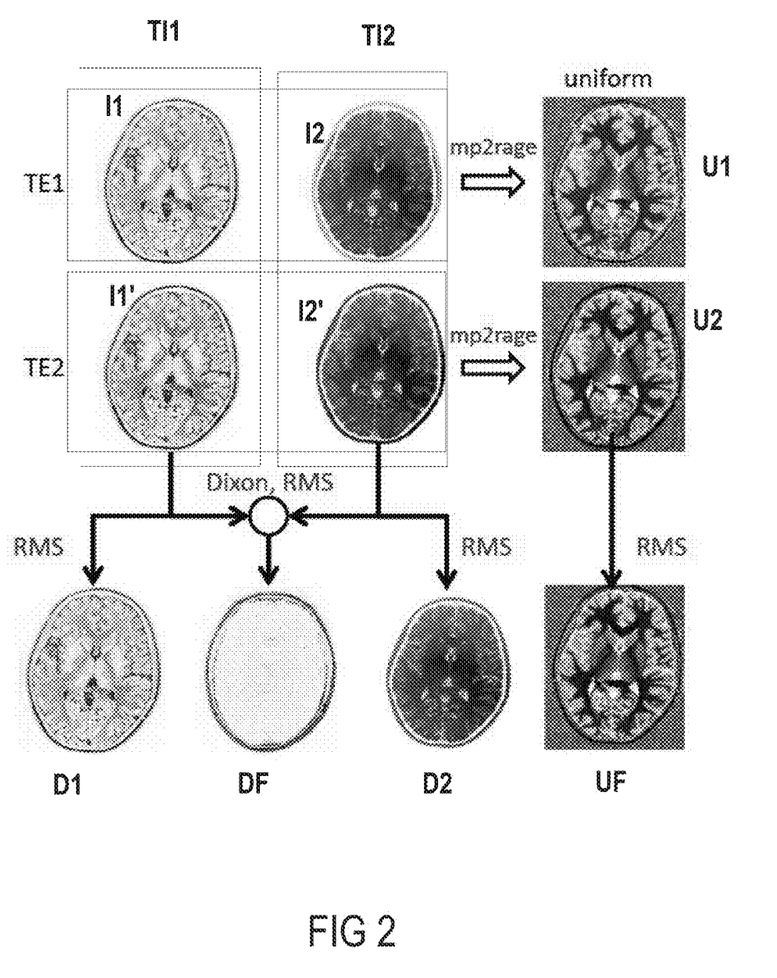
FIG. 2 shows a schematic flow chart of the combinations of images obtained according to the present invention by means of the claimed MRI sequence.

FIGS. 1 and 2 schematically illustrate a preferred embodiment of an atlas-free magnetic resonance imaging method according to the invention. The present method is configured for imaging at least one part of a brain and comprises the following steps:

using an MRI sequence 3 configured for acquiring two image volumes I1, I2, I1', I2' of said part, respectively a first image volume I1, I1' and a second image volume I2, I2', for each echo time TE1, TE2 and at different inversion times TI1, TI2 within a single acquisition, wherein said MRI sequence 3 is a double-echo MP2RAGE sequence 1 using Dixon method 2 for acquiring a fat-water separated image of said part, preferentially said MP2RAGE sequence 1 is performed using a GeneRalized Autocalibrating Partially Parallel Acquisition (GRAPPA) and is in particular characterized by the following parameters:
 TI1/TI2/TR=700/2500/5000 ms,
 TE1/TE2=2.44/6.06 ms,
 GRAPPA with a reduction factor R=3,
 TA=8:52 min is the total acquisition time;

using MRI and said MRI sequence for acquiring said two image volumes I1, I2, I1', I2', for each echo time TE1, TE2, wherein per echo time, the first image volume I1, I1' is acquired at the first inversion time TI1, the second image volume I2, I2' is acquired at the second inversion time TI2;

for each echo time TE1, TE2, combining said first and second image volumes I1, I2, I1', I2' into a "uniform" image U1, U2, i.e. said homogenous image, wherein a first uniform image U1 is obtained from the combination of the image volumes I1, I2 at the first echo time TE1, and a second uniform image U2 is obtained from the combination of the image volumes I1', I2' at the second echo time TE2. Preferentially, the present method proposes an increase of the readout bandwidth for fitting the two echo readouts free of a change of an MP2RAGE protocol;

after optionally applying a homodyne phase filter to said two image volumes I1, I2, I1', I2' at each echo time TE1, TE2, using Dixon method for obtaining said fat-water separated image from the first and/or second image volumes, wherein a 2-point Dixon image decomposition might be preferentially performed for generating a first fat-water separated image D1 from the first image volumes I1, I1' at the first inversion time TI1 and/or a second fat-water separated image D2 from the second image volumes I2, I2' at the second inversion time TI2;

preferentially, a combination of:
the first fat-water separated image D1 and the second fat-water separated image D2 into a final fat-water separated image DF, and/or
the first uniform image U1 and the second uniform image U2 into a final uniform image UF, and/or
the second image volumes I2, I2' of the second inversion time TI2 obtained at the first and second echo time into a final second image volume,
wherein the combination is performed by calculating the root mean square (RMS) of the images;

feeding a multichannel image segmentation algorithm with the combined images, namely the final fat-water separated image DF, the final uniform image UF, the final second image volume, wherein said multichannel image segmentation algorithm uses a Markov random field (MRF) model (see Van Leemput et al., IEEE Transactions on Medical Imaging 18(10), 897-908 (1999); Roche et al., Medical Image Analysis 15(6) 830-839 (2011)) for segmenting said part into multiple classes of cranial tissues. Advantageously, inputting the final second image volume to the multichannel image segmentation algorithm provides a uniform background intensity that may counterbalance the lack of contrast of the final uniform image which results from background noise enhancement;

outputting a segmented image of the part of the brain. The segmented image is an output of the multichannel image segmentation algorithm obtained when inputting the combined images.

Preferably, the multichannel image segmentation algorithm partitions the input image in seven tissue classes representing grey matter, white matter, fluid, dura matter, muscle, fat, and air. Preferentially, the multichannel image segmentation algorithm comprises 3 steps to achieve segmentation in 7 classes, each step being based on the variational expectation-maximization (VEM) algorithm (Van Leemput et al., IEEE Transactions on Medical Imaging 18(10), 897-908 (1999); Roche et al., Medical Image Analysis 15(6) 830-839 (2911)). A first step using a 5-class segmentation model partitions the input image in fluid, gray matter, white matter, non-brain tissues and air. In a second step, voxels classified as air are removed from the image, and a 6-class segmentation model is used to partition the remaining voxels in fluid, gray matter, white matter, dura matter, fat and skin. A third step computes the main connected component of the set composed by the union of voxels classified as gray matter, white matter and fluid, removes the voxels not included in the above-mentioned main connected component, and uses a 4-class segmentation model to partition the remaining voxels in cortical gray matter, deep gray matter, white matter and cerebrospinal fluid.

Preferentially, the method according to the invention includes a total intracranial volume extraction achieved by means of standard mathematical morphology operations in order to remove non-brain voxels classified as fluid.

Preferentially, the present invention comprises applying the claimed method to each scan of a brain for reconstructing a 3D brain image and calculating a grey matter volume from said scans of the brain performed according to the present method.

Finally, the proposed invention alleviates the need to use a digital atlas to drive image segmentation. Consequently, the whole processing pipeline may be faster and less biased towards the normal anatomy encoded by the atlas which is of high importance in the context of detecting disease-related morphological changes since the anatomy of diseased subjects may significantly deviate from the atlas as a consequence or feature of their pathology. Additionally, the proposed invention can dramatically reduce segmentation errors at the interface between the TIV and surrounding tissues if the input images are of sufficiently good quality.

While the present method has been disclosed according to the preferred embodiment of the invention, those of ordinary skill in the art will understand that other embodiments have also been enabled. Even though the foregoing discussion has focused on a particular embodiment, it is understood that other configurations are contemplated. The terms "a", "an" and "the" mean "one or more" unless expressly specified otherwise.

In light of the wide variety of possible data monitoring systems and methods, the detailed embodiment is intended to be illustrative only and should not be taken as limiting the scope of the invention. Rather, what is claimed as the invention is all such modifications as may come within the spirit and scope of the following claims and equivalents thereto.

None of the description in this specification should be read as implying that any particular element, step or function is an essential element which must be included in the claim scope. The scope of the patented subject matter is defined only by the allowed claims and their equivalents. Unless explicitly recited, other aspects of the present invention as described in this specification do not limit the scope of the claims.

The invention claimed is:

1. An atlas-free magnetic resonance imaging method configured for imaging at least one part of a brain, the method comprising the steps of:

acquiring two image volumes using a magnetic resonance imaging sequence, respectively a first image volume and a second image volume, of the part of the brain at mutually different inversion times within a single acquisition, wherein the magnetic resonance imaging sequence is a Magnetization-Prepared 2 Rapid Gradient-Echoes sequence with a first echo time TE1 and a second echo time TE2 for each inversion contrast;

acquiring a fat-water separated image of the part using a Dixon method, so that the fat and water component are in-phase and opposed-phase;

acquiring, for each echo time TE1 and TE2, the two image volumes using magnetic resonance imaging and the magnetic resonance imaging sequence, respectively the first image volume and the second image volume at the first echo time, and the first image volume and the second image volume at the second echo time;

combining the two image volumes obtained at the first echo time to form a first uniform image, and combining the two image volumes obtained at the second echo time to form a second uniform image;

applying a fat-water separation method to the first image volume of the first and second inversion time TI1 and TI2 for obtaining a first fat-water separated image and/or applying the fat-water separation method to the second image volume of the first and second inversion time TI1 and TI2 for obtaining a second fat-water separated image;

inputting a multichannel image segmentation algorithm with:
 a final uniform image resulting from a combination of the first uniform image at the first echo time and the second uniform image at the second echo time;
 a final fat-water separated image resulting from a combination of the fat-water separated images;
 a final second image volume resulting from a combination of the second image volumes;
wherein the multichannel image segmentation algorithm uses a Markov random field model for segmenting the part into multiple classes of cranial tissues from data arising from the input images to enforce topological constraints without an atlas, wherein the topological constraints impose spatial relations between different tissues depending on tissue association; and outputting a segmented image of the part.

2. The atlas-free magnetic resonance imaging method of claim 1, wherein the Magnetization-Prepared 2 Rapid Gradient-Echoes sequence is performed using a parallel imaging technique.

3. The atlas-free magnetic resonance imaging method of claim 1, further comprising the step of applying a homodyne phase filter to the two image volumes at each echo time.

4. The atlas-free magnetic resonance imaging method of claim 1, further comprising the step of performing a 2-point Dixon image decomposition for generating the first fat-water separated image from the first image volumes at the first inversion time and/or the second fat-water separated image from the second image volumes at the second inversion time.

5. The atlas-free magnetic resonance imaging method of claim 1, further comprising the step of combining:
 the first fat-water separated image and the second fat-water separated image into a final fat-water separated image; and/or
 the first uniform image and the second uniform image into a final uniform image; and/or
 the second image volumes of the second inversion time obtained at the first and second echo time into a final second image volume;
thereby performing the combining steps by calculating a root mean square of the images.

6. The atlas-free magnetic resonance imaging method of claim 1, further comprising the step of, after the inputting step, removing voxels outside the total intra-cranial volume to determine a total intracranial volume extraction by way of standard mathematical morphology operations.

7. The atlas-free magnetic resonance imaging method of claim 1, further comprising the step of configuring the multichannel image segmentation algorithm to segment the brain in seven tissue classes, including grey matter, white matter, fluid, dura matter, muscle, fat, and air.

8. An atlas-free magnetic resonance imaging system comprising components configured to:
 acquire two image volumes using a magnetic resonance imaging sequence, respectively a first image volume and a second image volume, of the part of the brain at mutually different inversion times within a single acquisition, wherein the magnetic resonance imaging sequence is a Magnetization-Prepared 2 Rapid Gradient-Echoes sequence with a first echo time TE1 and a second echo time TE2 for each inversion contrast;
 acquire a fat-water separated image of the part using a Dixon method, so that the fat and water component are in-phase and opposed-phase;
 acquire, for each echo time TE1 and TE2, the two image volumes using magnetic resonance imaging and the magnetic resonance imaging sequence, respectively the first image volume and the second image volume at the first echo time, and the first image volume and the second image volume at the second echo time;
 combine the two image volumes obtained at the first echo time to form a first uniform image, and combine the two image volumes obtained at the second echo time to form a second uniform image;
 apply a fat-water separation method to the first image volume of the first and second inversion time TI1 and TI2 for obtaining a first fat-water separated image and/or apply the fat-water separation method to the second image volume of the first and second inversion time TI1 and TI2 for obtaining a second fat-water separated image;
 input a multichannel image segmentation algorithm with:
  a final uniform image resulting from a combination of the first uniform image at the first echo time and the second uniform image at the second echo time;
  a final fat-water separated image resulting from a combination of the fat-water separated images;
  a final second image volume resulting from a combination of the second image volumes;
 wherein the multichannel image segmentation algorithm uses a Markov random field model for segmenting the part into multiple classes of cranial tissues from data arising from the input images to enforce topological constraints without an atlas, wherein the topological constraints impose spatial relations between different tissues depending on tissue association; and
 output a segmented image of the part.

9. An atlas-free magnetic resonance imaging system, comprising a computer-readable medium storing computer program instructions in non-transitory form, said computer program instructions executable by a processor to perform at least the following steps:
 acquiring a fat-water separated image of a part of a brain using a Dixon method;
 acquiring for a first echo time TE1 and a second echo time TE2 two image volumes, respectively a first image volume and a second image volume at the first echo time, and a first image volume and a second image volume at the second echo time;
 combining the two image volumes obtained at the first echo time to form a first uniform image, and combining the two image volumes obtained at the second echo time to form a second uniform image;
 applying a fat-water separation method to the first image volume of the first and second inversion time TI1 and TI2 for obtaining a first fat-water separated image and/or applying the fat-water separation method to the second image volume of the first and second inversion time TI1 and TI2 for obtaining a second fat-water separated image;
 inputting a multichannel image segmentation algorithm with:

a final uniform image resulting from a combination of the first uniform image at the first echo time and the second uniform image at the second echo time;

a final fat-water separated image resulting from a combination of said fat-water separated images;

a final second image volume resulting from a combination of said second image volumes;

wherein the multichannel image segmentation algorithm uses a Markov random field model for segmenting the part into multiple classes of cranial tissues from data arising from the input images to enforce topological constraints without an atlas, wherein the topological constraints impose spatial relations between different tissues depending on tissue association; and outputting a segmented image of the part of the brain.

* * * * *